US006611055B1

(12) United States Patent
Hashemi

(10) Patent No.: US 6,611,055 B1
(45) Date of Patent: Aug. 26, 2003

(54) LEADLESS FLIP CHIP CARRIER DESIGN AND STRUCTURE

(75) Inventor: Hassan S. Hashemi, Laguna Niguel, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 09/877,912

(22) Filed: Jun. 8, 2001

Related U.S. Application Data

(63) Continuation-in-part of application No. 09/713,834, filed on Nov. 15, 2000.

(51) Int. Cl.$^7$ .......................... H01L 23/10; H01L 23/48
(52) U.S. Cl. ...................... 257/706; 257/707; 257/779; 257/778; 257/782; 257/777; 257/737; 257/738
(58) Field of Search ................................ 257/778, 779, 257/782, 706, 707, 777, 737, 738

(56) References Cited

U.S. PATENT DOCUMENTS

| 5,309,324 | A | * | 5/1994 | Herandez et al. ........... 361/734 |
| 5,506,755 | A | | 4/1996 | Miyagi et al. |
| 5,640,048 | A | | 6/1997 | Selna |
| 5,646,826 | A | | 7/1997 | Katchmar |
| 5,721,454 | A | * | 2/1998 | Palmer ....................... 257/700 |
| 5,786,628 | A | | 7/1998 | Beilstein, Jr. et al. |
| 5,808,873 | A | | 9/1998 | Celaya et al. |
| 5,814,889 | A | | 9/1998 | Gaul |
| 5,923,084 | A | | 7/1999 | Inoue et al. |
| 6,064,114 | A | * | 5/2000 | Higgins, III ................ 257/698 |
| 6,075,710 | A | * | 6/2000 | Lau ............................. 61/780 |
| 6,097,089 | A | | 8/2000 | Gaku et al. |
| 6,191,477 | B1 | | 2/2001 | Hashemi |
| 6,201,300 | B1 | | 3/2001 | Tseng et al. |
| 6,226,183 | B1 | | 5/2001 | Weber et al. |
| 6,236,366 | B1 | | 5/2001 | Yamamoto et al. |
| 6,265,767 | B1 | | 7/2001 | Gaku et al. |
| 6,265,771 | B1 | | 7/2001 | Ference et al. |
| 6,265,772 | B1 | | 7/2001 | Yoshida |
| 6,278,181 | B1 | * | 8/2001 | Maley ........................ 257/712 |
| 6,281,042 | B1 | | 8/2001 | Ahn et al. |
| 6,282,095 | B1 | | 8/2001 | Houghton et al. |
| 6,421,013 | B1 | | 7/2002 | Chung |
| 2002/0172025 | A1 | * | 11/2002 | Megahed et al. ........... 361/767 |

FOREIGN PATENT DOCUMENTS

| EP | 2-58358 | 2/1990 |
| EP | 9-153679 | 6/1997 |
| EP | 10-313071 | 11/1998 |
| EP | 10-335521 | 12/1998 |

OTHER PUBLICATIONS

Fujitsu Limited, Presentation slides regarding "BCC (Bump Chip Carrier)," 24 pages, 1997, United States.

* cited by examiner

Primary Examiner—Allan R. Wilson
Assistant Examiner—Joseph Nguyen
(74) Attorney, Agent, or Firm—Farjami & Farjami LLP

(57) ABSTRACT

One disclosed embodiment comprises a substrate having a top surface for receiving a semiconductor die with a number of solder bumps on its active surface. The disclosed embodiment further comprises a printed circuit board attached to a bottom surface of the substrate. Another disclosed embodiment comprises at least one via in the substrate. The at least one via provides an electrical and thermal connection between a signal pad of the die and the printed circuit board. The at least one via provides an electrical connection between a substrate signal pad and the printed circuit board. The substrate signal pad is connected to the signal pad of the die by a signal solder bump. The at least one via also provides an electrical connection between the signal pad of the die and a land that is electrically connected to the printed circuit board.

16 Claims, 6 Drawing Sheets

LEADLESS FLIP CHIP CARRIER DESIGN AND STRUCTURE

This application is a continuation in part of, and claims benefit of the filing date of, and hereby incorporates fully be reference, the pending parent application entitled "Leadless Chip Carrier Design and Structure" Ser. No. 09/713,834 filed Nov. 15, 2000 and assigned to the assignee of the present application.

BACKGROUND OF THE INVENTION

1. Field of the Invention

The present invention is generally in the field of semiconductor chip packaging. More specifically, the present invention is in the field of leadless chip carrier design and structure.

2. Background Art

As microelectronic devices become more integrated with increased functionality and higher levels of performance, the complexity of the various packages, structures, or carriers that are used to house the semiconductor die itself grows proportionally. As a result of the increase in functionality and performance, among other things, the density of interconnects between semiconductor die and the structure or carrier that houses the die has correspondingly increased. Flip chip technology has emerged as one solution to the new challenges presented by the increase in density of interconnects between the semiconductor die and the structure that houses the die and which provides electrical connection to "off-chip" devices.

By way of background, flip chip technology is a surface mount technology wherein the semiconductor die is "flipped" over so that the active surface of the die faces the structure or carrier employed to house the die. In flip chip technology, the electrical contact between the die and the structure that houses the die is achieved through "solder bumps" that are placed on the active surface of the semiconductor die. In flip chip technology, "solder bumps" replace the conventional bonding wires used to provide electrical contact between the die and the structure that houses the die. Flip chip technology is often utilized in semiconductor devices running at high frequencies, such as RF ("Radio Frequency") semiconductor devices. However, the use of flip chip technology in higher frequency devices, such as RF semiconductor devices, presents challenges in the manufacture of various packages, structures, or carriers that are used to house the "flip chip."

Recently, "flip chips" have gained increased popularity over conventional dies using wire bond interconnects. A conventional die interconnects with a chip carrier through bond wires that connect the peripheral bond pads on the die to bond pads on the chip carrier. In contrast, a "flip chip" has an array of solder bumps on the active surface of the die that connect to pads on the "flip chip" carrier. Because a "flip chip" can connect to the "flip chip" carrier over the entire active surface of the die, the "flip chip" can support a larger number of interconnects than a die of similar size using wire bond interconnects.

There have been various attempts in the art to arrive at different chip carrier designs. Japanese Publication Number 10313071, published Nov. 24, 1998, titled "Electronic Part and Wiring Board Device," on which Minami Masumi is named an inventor, discloses a structure to dissipate heat emitted by a semiconductor device. The structure provides metallic packed through-holes formed in a wiring board that transmit heat emitted from a bare chip through a heat dissipation pattern on the bottom of the wiring board, and then to a heat dissipation plate.

Japanese Publication Number 02058358, published Feb. 27, 1990, titled "Substrate for Mounting Electronic Component," on which Fujikawa Osamu is named an inventor, discloses a substrate with a center area comprising eight thermally conductive resin-filled holes sandwiched between metal-plated top and bottom surfaces. An electronic component is then attached to the center area of the top metal-plated surface of the substrate with silver paste adhesive to improve heat dissipation and moisture resistance.

Japanese Publication Number 09153679, published Jun. 10, 1997, titled "Stacked Glass Ceramic Circuit Board," on which Miyanishi Kenji is named an inventor, discloses a stacked glass ceramic circuit board comprising seven stacked glass ceramic layers. The multi-layer stacked glass ceramic circuit board further comprises a number of via holes comprising gold or copper with surface conductors on the top and bottom surfaces covering the via holes. The top conductor functions as a heat sink for an IC chip.

Japanese Publication Number 10335521, published Dec. 18, 1998, titled "Semiconductor Device," on which Yoshida Kazuo is named an inventor, discloses a thermal via formed in a ceramic substrate, with a semiconductor chip mounted above the thermal via. The upper part of the hole of the thermal via is formed in a ceramic substrate in such a manner that it becomes shallower as it goes outward in a radial direction.

It is noted that an advantageous combination of the "flip chip" technology with conventional chip carrier structures has not been, hereinbefore, achieved. A conventional chip carrier structure for mounting a chip on a printed circuit board has a number of shortcomings. For example, conventional chip carriers still introduce too much parasitics and still do not provide a low inductance and resistance ground connection to the die. Conventional chip carriers also have a very limited heat dissipation capability and suffer from the concomitant reliability problems resulting from poor heat dissipation. As an example, in high frequency applications, such as in RF applications, several watts of power are generated by a single die. Since the semiconductor die and the chip carrier are made from different materials, each having a different coefficient of thermal expansion, they will react differently to the heat generated by the die. The resulting thermal stresses can cause cracking or a separation of the die from the chip carrier and, as such, can result in electrical and mechanical failures. Successful dissipation of heat is thus important and requires a novel structure and method.

Therefore, there exists a need for a novel and reliable structure and method to support, house, and electrically connect the "flip chip" to a printed circuit board while also overcoming the problems faced by conventional chip carriers. More specifically, there exists a need for a novel and reliable structure and method to support, house, and electrically connect the "flip chip" to a printed circuit board while providing low parasitics, efficient heat dissipation and a low inductance and resistance ground connection.

SUMMARY OF THE INVENTION

The present invention is directed to leadless flip chip carrier design and structure. The present invention discloses a flip chip structure and method for providing efficient dissipation of heat generated by the semiconductor die. The present invention further discloses a flip chip structure and method for providing low parasitics, and a low inductance and resistance ground connection.

In one embodiment, the present invention comprises a substrate having a top surface for receiving a semiconductor die with a number of solder bumps on its active surface. For example, the substrate can comprise organic material such as polytetrafluoroethylene material or an FR4 based laminate material. By way of further example, the substrate can comprise a ceramic material. The present invention further comprises a printed circuit board attached to a bottom surface of the substrate.

In one embodiment, the invention comprises at least one via in the substrate. The invention's at least one via provides an electrical connection between a signal pad of the die and the printed circuit board. The at least one via can comprise an electrically and thermally conductive material such as copper. The at least one via provides an electrical connection between a substrate signal pad and the printed circuit board. The at least one via can abut or overlap the substrate signal pad. The substrate signal pad is connected to the signal pad of the die by a signal solder bump. The at least one via also provides an electrical connection between the signal pad of the die and a land that is electrically connected to the printed circuit board. Moreover, the at least one via can abut or overlap the land.

DETAILED DESCRIPTION OF THE INVENTION

The present invention is directed to leadless flip chip carrier design and structure. The following description contains specific information pertaining to various embodiments and implementations of the invention. One skilled in the art will recognize that the present invention may be practiced in a manner different from that specifically discussed in the present application. Moreover, some of the specific details of the invention are not discussed in order not to obscure the invention. The specific details not described in the present application are within the knowledge of a person of ordinary skills in the art.

The drawings in the present application and their accompanying detailed description are directed to merely example embodiments of the invention. To maintain brevity, other embodiments of the invention that use the principles of the present invention are not specifically described in the present application and are not specifically illustrated by the present drawings.

Figure 1:
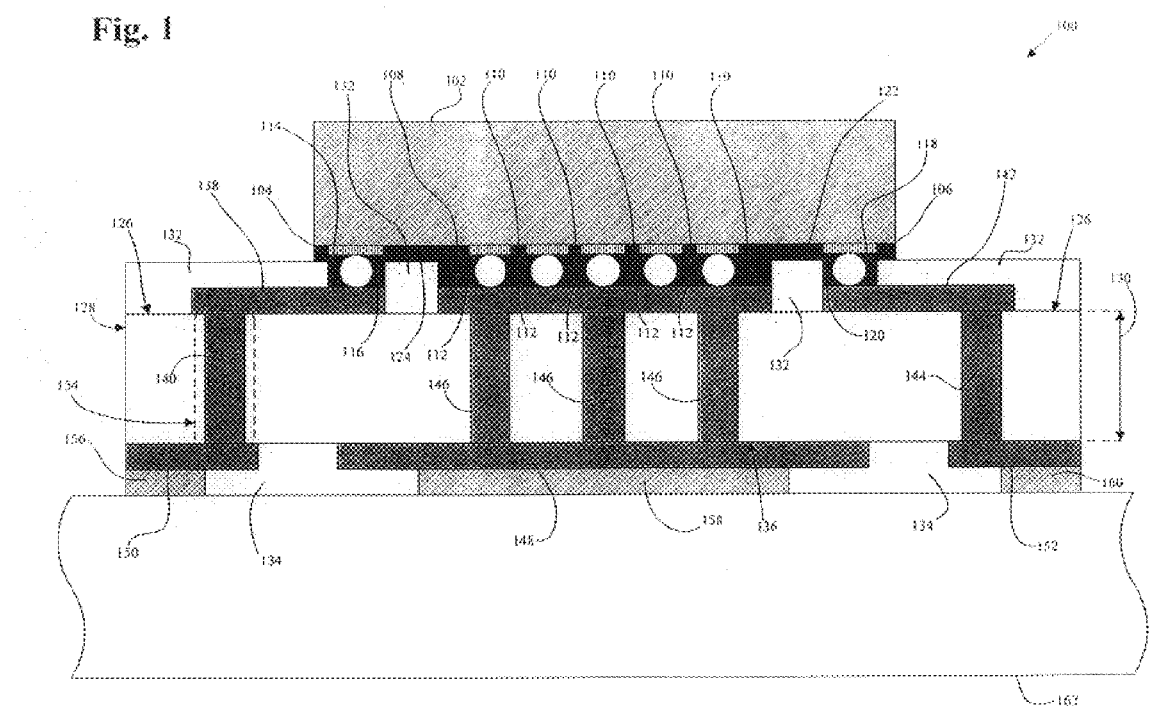
FIG. 1 illustrates a cross-sectional view of an embodiment of the present invention.

Structure 100 in FIG. 1 illustrates a cross-sectional view of an exemplary structure in accordance with one embodiment of the present invention. Structure 100 is shown attached to printed circuit board ("PCB") 162 in FIG. 1.

Referring to structure 100, semiconductor die 102 is mounted on top surface 126 of substrate 128 utilizing flip chip technology. It is noted that a "semiconductor die," such as semiconductor die 102, 20 is also referred to as a "chip" or a "semiconductor chip" in the present application. As is known in the art, flip chip technology is a surface mount technology wherein the die is "flipped" over so that the active surface of the die faces the interconnect substrate. Since the active surface of the die faces the interconnect substrate, it is possible for the die to make electrical contact with the interconnect substrate directly and without the use of bond wires. In flip chip technology, the electrical contact between the die and the interconnect substrate is achieved through an area array comprised of "solder bumps" that are placed on the active surface of the die. "Flip chip" technology refers, among other things, to the process and structure associated with the "flipped" semiconductor die to bring the solder bumps on the active surface of the semiconductor die in direct contact with the interconnect substrate.

Substrate 128 can comprise a two-layer organic laminate such as polytetrafluoroethylene. However, substrate 128 can comprise other organic materials such as FR4 based laminate. In one embodiment of the present invention, substrate 128 can be a ceramic material. In structure 100 in FIG. 1, thickness 130 of substrate 128 is approximately 200.0 microns; however, the thickness of substrate 128 can be different in other embodiments of the invention.

Also shown in FIG. 1, solder bumps 110 connect semiconductor die ground pads 112 and support pad 108. Typically, solder bumps 110 are about 100.0 to 125.0 microns in diameter. Support pad 108 is fabricated on top surface 126 of substrate 128. In structure 100 in FIG. 1, support pad 108 can comprise copper; however, support pad 108 can comprise other metals. For example, support pad 108 can be aluminum, molybdenum, tungsten, or gold. The fabrication of support pad 108 will be further described below in relation to FIG. 5.

Continuing with FIG. 1, solder bump 114 connects semiconductor die signal pad 116 and substrate signal pad 104. Solder bumps, such as solder bump 114, are also referred to as "signal solder bumps" in the present application. Substrate signal pad 104 is fabricated on top surface 126 of substrate 128. In structure 100, substrate signal pad 104 can be copper; however, substrate signal pad 104 can comprise other metals. For example, substrate signal pad 104 can be aluminum, molybdenum, tungsten, or gold. As further shown in FIG. 1, solder bump 118 connects semiconductor die signal pad 120 and substrate signal pad 106. Similar to substrate signal pad 104, substrate signal pad 106 is fabricated on top surface 126 of substrate 128. In structure 100, substrate signal pad 106 can be copper; however, substrate signal pad 106 can comprise other metals. For example, substrate signal pad 106 can be aluminum, molybdenum, tungsten, or gold. The fabrication of substrate signal pads 104 and 106 will be further described below in relation to FIG. 5.

Also in FIG. 1, underfill 122 is dispensed in the interface area between active surface 124 of semiconductor die 102 and top surface 126 of substrate 128. In structure 100, underfill 122 can be a polymer containing phase change material ("PCM") microsheres. Examples of such underfill are disclosed in a co-pending United States patent application entitled "Method and Structure for Temperature Stabilization in Flip Chip Technology," Ser. No. 09/493,591, filed Jan. 31, 2000, and assigned to the assignee of the present application. The disclosure in that co-pending application is hereby incorporated fully by reference into the present application.

As discussed in that co-pending application, PCM underfill typically consists of a polymer used in packaging semiconductor devices, within which are PCM microspheres. The PCM microspheres act as cushions to dampen the range of temperature excursions of the semiconductor die. The reduction of the range of temperature excursions in a semiconductor die mounted on an interconnect substrate utilizing flip chip technology results in a reduction of thermal and mechanical stress during operation of the semiconductor die and thus improves the performance and reliability of the semiconductor die.

As seen in FIG. 1, solder mask 132 is applied to top surface 126 of substrate 128. The thickness of solder mask 132 can be, for example, 10.0 to 30.0 microns. Solder mask 132 can be AUS-5; however, solder mask 132 may comprise other materials. Solder mask 134 is applied to bottom surface 136 of substrate 128. The thickness of solder mask 134 can be, for example, 10.0 to 30.0 microns. Solder mask 134 can also be AUS-5; however, solder mask 134 may comprise other materials. Trace 138 connects substrate signal pad 104 and via 140. Trace 138 is fabricated on top surface 126 of substrate 128. In structure 100, trace 138 can be copper; however, trace 138 can comprise other metals. For example, trace 138 can be aluminum, molybdenum, tungsten, or gold. The fabrication of trace 138 will be further described below in relation to FIG. 5. Trace 142 connects substrate signal pad 106 and via 144. Trace 142 is fabricated on top surface 126 of substrate 128. In structure 100, trace 142 can be copper; however, trace 142 can comprise other metals. For example, trace 142 can be aluminum, molybdenum, tungsten, or gold. The fabrication of traces 142 will be further described below in relation to FIG. 5.

Continuing with FIG. 1, vias 146, also referred to as a "first plurality of vias" in the present application, and via 140 and via 144, also referred to as a "second plurality of vias" in the present application, are situated within substrate 128. Via 140, via 144, and vias 146 extend from top surface 126 to bottom surface 136 of substrate 128. Via 140, via 144, and vias 146 can comprise a thermally, as well as electrically, conductive material. Via 140, via 144, and vias 146 can comprise copper and, in fact, in exemplary structure 100, via 140, via 144, and vias 146 are filled with copper. However, via 140, via 144, and vias 146 can be filled with other metals without departing from the scope of the present invention. In another embodiment of the present invention, via 140, via 144, and vias 146 may not be completely filled with a metal and may have a hollow center. Generally, vias 146, via 140, and via 144 have similar structures. As such, and by way of an illustrative example, the structure of exemplary via 140 will be described in greater detail in relation to FIGS. 3A and 3B, and specifically with respect to the region enclosed by dashed line 154 (which corresponds to the region enclosed by dashed line 354 in FIG. 3B).

Also shown in FIG. 1, land 150 is fabricated on bottom surface 136 of substrate 128. In structure 100, land 150 can comprise copper; however, land 150 can comprise other metals such as aluminum, molybdenum, tungsten, or gold. The fabrication of land 150 will be further described below in relation to FIG. 5. Land 150 is attached to PCB 162 by solder 156. However, other methods known in the art may be used to attach land 150 to PCB 162. In structure 100, land 150 overlaps via 140. In another embodiment of the present invention, instead of overlapping via 140, land 150 abuts via 140.

Similar to land 150, land 152 is fabricated on bottom surface 136 of substrate 128. In structure 100, land 152 can comprise copper; however, land 150 can comprise other metals such as aluminum, molybdenum, tungsten, or gold. The fabrication of land 152 will be further described below in relation to FIG. 5. Land 152 is attached to PCB 162 by solder 160. However, other methods known in the art may be used to attach land 152 to PCB 162. In structure 100, land 152 overlaps via 144. In another embodiment of the present invention, land 152 can abut via 144.

Further shown in FIG. 1, heat spreader 148 is fabricated on bottom surface 136 of substrate 128. In structure 100, heat spreader 148 can comprise copper; however, heat spreader 148 can comprise other metals. For example, heat spreader 148 can comprise aluminum, molybdenum, tungsten, or gold. In exemplary structure 100, heat spreader 148 is attached to PCB 162 by solder 158. However, other methods known in the art may be used to attach heat spreader 148 to PCB 162. The fabrication of heat spreader 148 will be discussed in detail in relation to FIG. 5.

Figure 2:
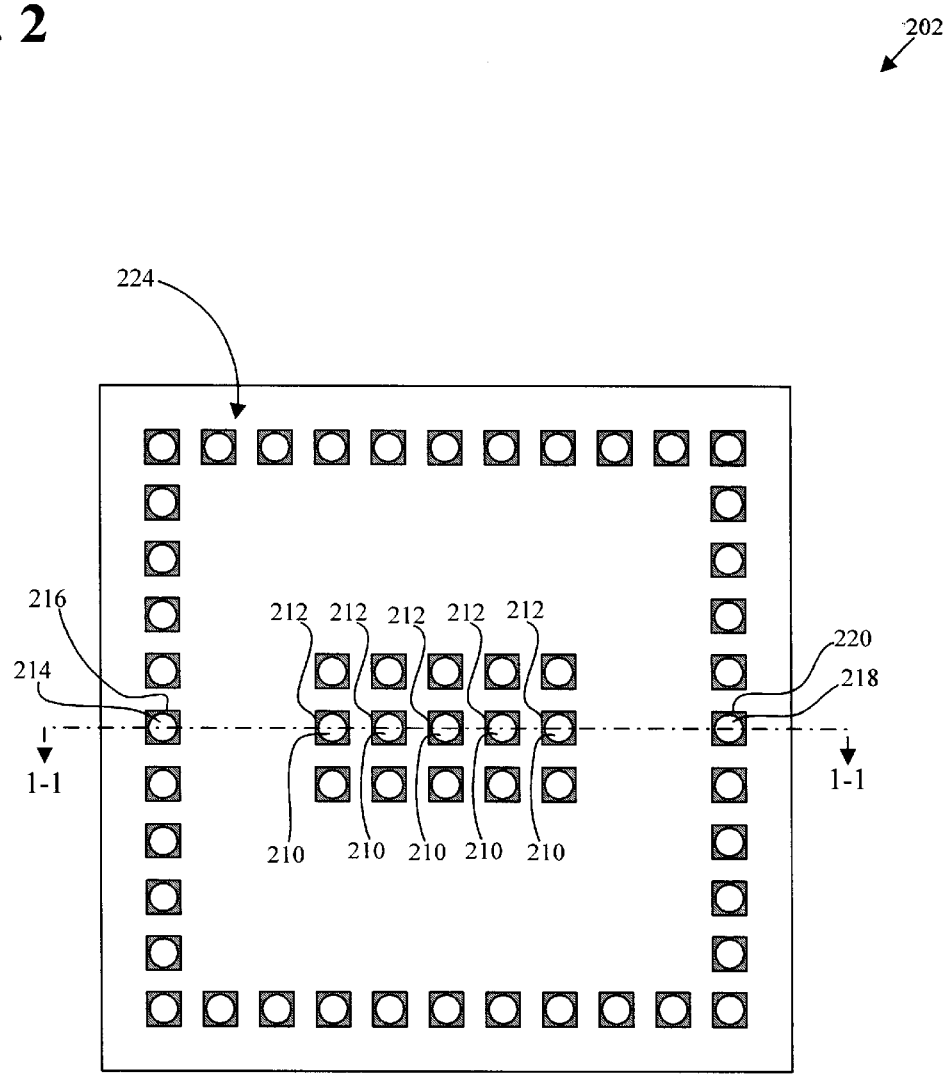
FIG. 2 illustrates a view of an exemplary semiconductor die with a number of solder bumps on its active surface.

Semiconductor die 202 in FIG. 2 illustrates a bottom view of an exemplary semiconductor die. Semiconductor die 202 in FIG. 2 corresponds to semiconductor die 102 in FIG. 1. However, semiconductor die 102 in FIG. 1 shows a cross-sectional view of semiconductor die 202 along line 1—1 of FIG. 2. In particular, active surface 224, semiconductor die signal pads 216 and 220, solder bumps 214 and 218, solder bumps 210, and semiconductor die ground pads 212, respectively, correspond to active surface 124, semiconductor die signal pads 116 and 120, solder bumps 114 and 118, solder bumps 110, and semiconductor die ground pads 112 in FIG. 1.

Now discussing FIG. 2 in more detail, solder bumps 214 and 218 are placed, respectively, on semiconductor die signal pads 216 and 220, while solder bumps 210 are placed on semiconductor die ground pads 212. Semiconductor die 202 is shown ready to be mounted on a top surface of a substrate, such as top surface 126 of substrate 128 in FIG. 1. Through the utilization of the flip chip technology, semiconductor die 202 is "flipped" over so that active surface 224 of semiconductor die 202 faces the top surface of the substrate. Solder bumps, such as solder bumps 214, 218 and 210, electrically connect active surface 224 of semiconductor die 202 with the top surface of the substrate. As shown in structure 100 in FIG. 1, solder bumps 114, 118, and 110 (corresponding respectively to solder bumps 214, 218, and 210) electrically connect active surface 124 of semiconductor die 102 and top surface 126 of substrate 128. It is noted that in FIG. 2, only solder bumps 214 and 218, solder bumps 210, semiconductor die signal pads 216 and 220, and semiconductor die ground pads 212 are specifically discussed herein to preserve brevity.

Figure 3A:
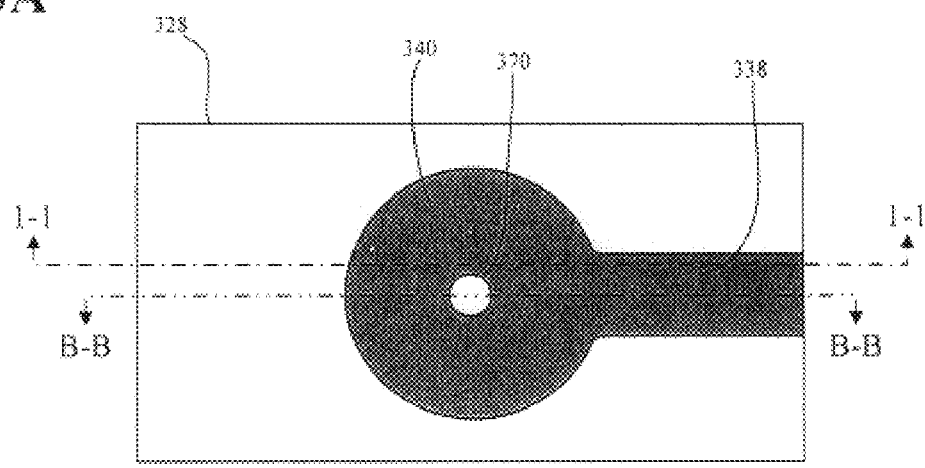
FIGS. 3A and 3B illustrate, respectively, a top view and a cross-sectional view of an exemplary via in an embodiment of the present invention.
Figure 3B:
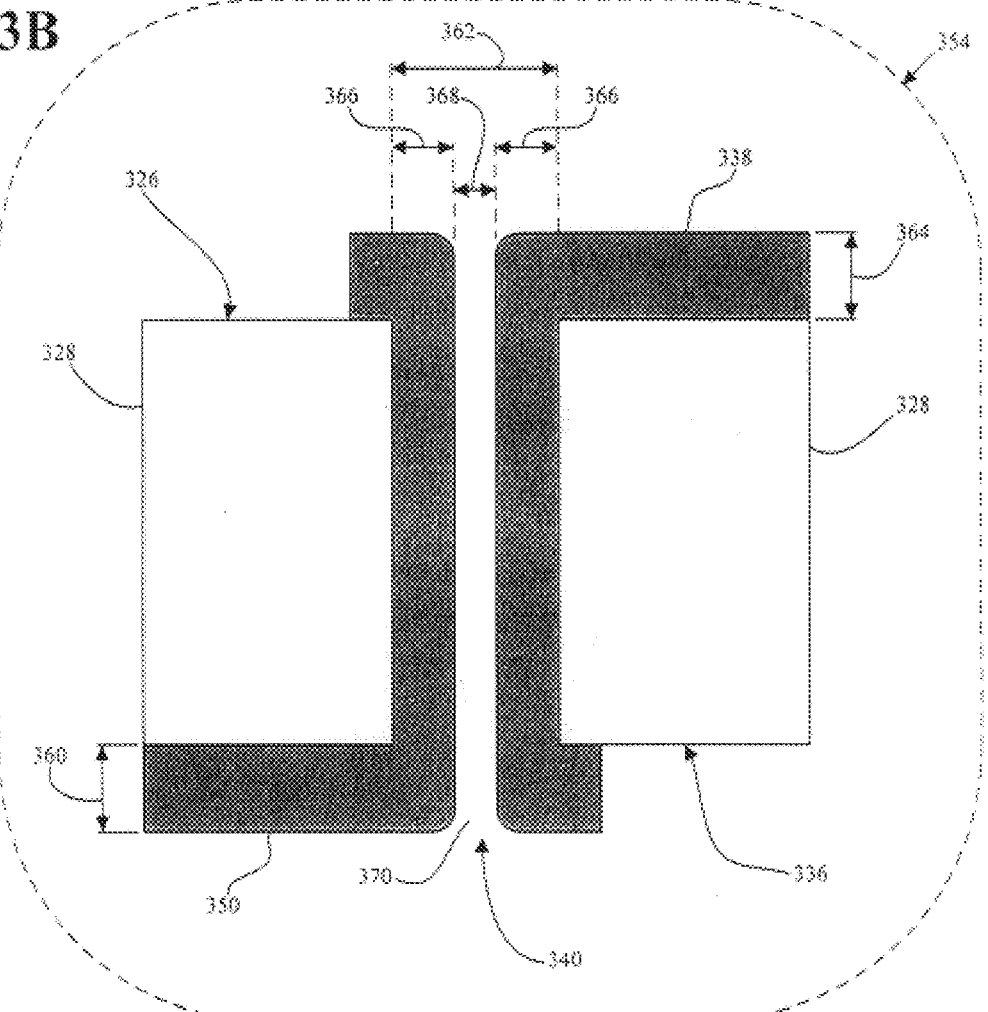

FIG. 3A shows a top view of region 354 in FIG. 3B, which corresponds to region 154 in FIG. 1. In particular, substrate 328, via 340, and trace 338, respectively, correspond to substrate 128, via 140, and trace 138 in FIG. 1. FIG. 3A also shows via hole 370. Via hole 370 cannot be seen in FIG. 1 which is a cross-sectional view along line 1—1 of FIG. 3A. However, via hole 370 can be seen in FIG. 3B since FIG. 3B is a cross-sectional view along line B—B of FIG. 3A. Via 340, trace 338, and via hole 370 are described in detail below in relation to FIG. 3B.

FIG. 3B shows a cross-sectional view of region 354 along line B—B of FIG. 3A. In particular, top surface 326, substrate 328, bottom surface 336, via 340, trace 338, and land 350 correspond, respectively, to top surface 126, substrate 128, bottom surface 136, via 140, trace 138, and land 150 in FIG. 1. In FIG. 3B, land thickness 360 can be approximately 12.7 to 30.0 microns. Via drill diameter 362 can be 150.0 microns while trace thickness 364 can be approximately 12.7 to 30.0 microns. Via wall thickness 366 can be approximately 20.0 microns. Via hole diameter 368 can be approximately 110.0 microns. It is noted that, for the purpose of ease of illustration, the various dimensions in FIGS. 3A and 3B are not drawn to scale.

The fabrication of via 340 begins with substrate 328. In one embodiment of the present invention, copper can be laminated on top surface 326 and bottom surface 336 of substrate 328. The thickness of the copper laminated on top surface 326 and bottom surface 336 of substrate 328 can be, for example, 15.0 microns. However, other metals may be laminated on top surface 326 and bottom surface 336 of substrate 328. For example, the metal laminated on top surface 326 and bottom surface 336 of substrate 328 can be aluminum, molybdenum, tungsten, or gold. Next, a via opening having drill diameter 362 is drilled through substrate 328 at a predetermined location. Substrate 328 is then plated with copper to produce a layer of copper on the inside of the via opening corresponding to via wall thickness 366. However, substrate 328 may be plated with other metals. Thus, via 340 is fabricated having via hole diameter 370 as shown in FIGS. 3A and 3B. The process illustrated above to fabricate via 340 also applies to the fabrication of via 144 and vias 146 in structure 100 in FIG. 1.

Figure 4:
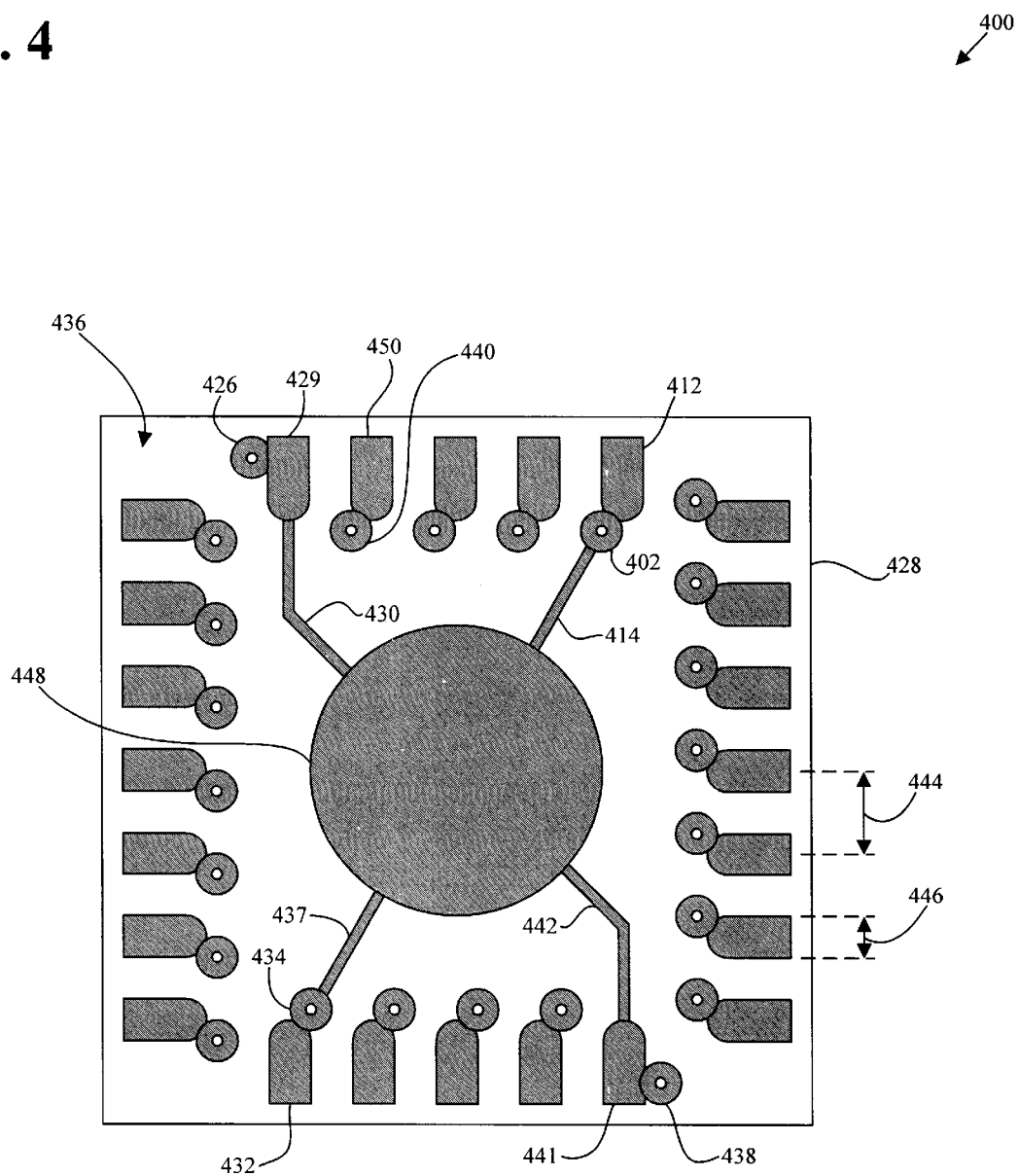
FIG. 4 illustrates a bottom view of an embodiment of the present invention after completion of a "saw singulation" step.

Structure 400 in FIG. 4 illustrates a bottom view of an exemplary structure in accordance with one embodiment of the present invention after completion of a "saw singulation" step which, briefly, involves dicing substrate 128 (FIG. 1) so as to achieve a "singulated" structure such as structure 100 in FIG. 1, corresponding to structure 400 in FIG. 4. The saw singulation step is one of the last steps in a process that is described in more detail in relation to FIG. 5. Structure 400 comprises substrate 428 corresponding to substrate 128 in FIG. 1. However, in contrast to structure 100 in FIG. 1, in structure 400 lands abut, instead of overlap, the vias. For example, land 450 is shown abutting, and not overlapping, via 440. This is in contrast to land 150 in FIG. 1, which is shown as overlapping, and not abutting, via 140. Additionally, traces that connect lands and vias to a heat spreader, such as traces 414, 430, 437, and 442 in FIG. 4, are not shown in structure 100 in FIG. 1.

Now discussing FIG. 4 in more detail, FIG. 4 shows bottom surface 436 of substrate 428. Lands 412, 429, 432, 441 and 450, respectively, abut vias 402, 426, 434, 438 and 440. Trace 414 connects via 402 and heat spreader 448. Trace 437 connects via 434 and heat spreader 448. Trace 430 connects land 429 and heat spreader 448. Trace 442 connects land 441 and heat spreader 448. Therefore, vias 402, 426, 434, and 438, respectively, are connected by traces 414, 430, 437, and 442 to heat spreader 448. In the exemplary embodiment shown in FIG. 4, "land pitch" 444 can be, for example, 500.0 microns and "land width" 446 can be, for example, 250.0 microns. It is noted that in FIG. 4, only vias 402, 426, 434, 438, and 440 and lands 412, 429, 432, 441, and 450 are specifically discussed herein to preserve simplicity.

Figure 5:
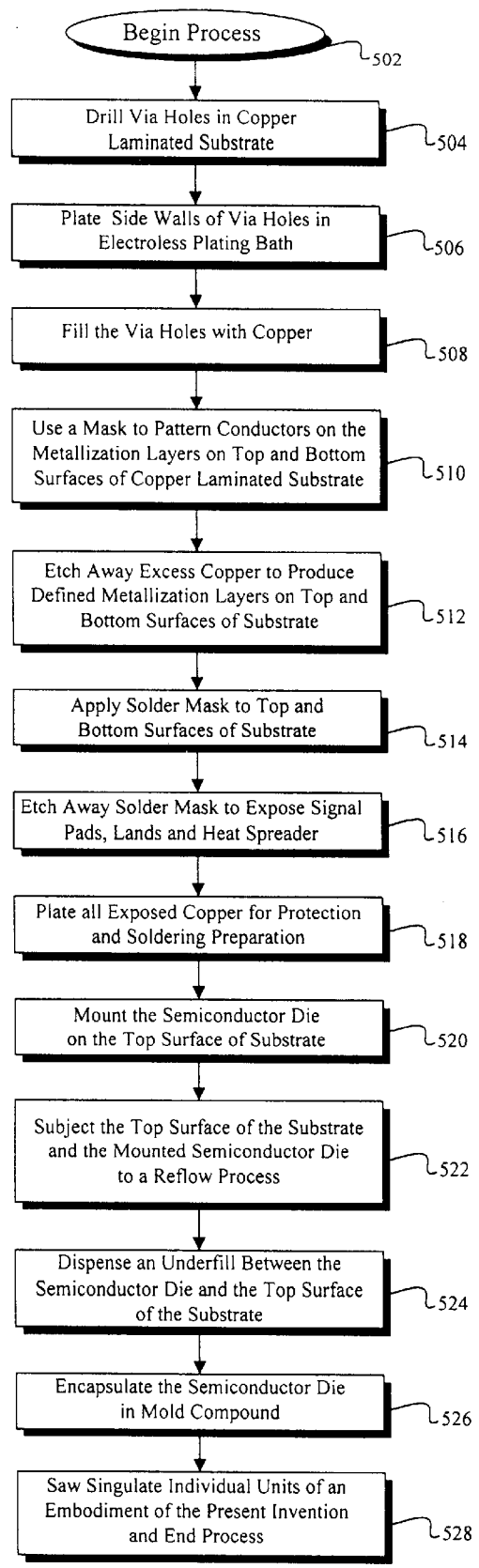
FIG. 5 illustrates a flow chart of an exemplary process by which an embodiment of the present invention is fabricated.

Referring to FIG. 5, an example of a process by which structure 100 in FIG. 1 is fabricated is now discussed. At step 502 the process begins. At step 504, via openings are drilled in a strip of copper laminated substrate. For example, the strip can be an 18-inch by 24-inch panel of copper laminated substrate. Substrate 128 in FIG. 1 corresponds to a section of the strip of the copper laminated substrate. Typically, multiple units of structure 100 are assembled on the strip of copper laminated substrate. In a later step in the assembly process, multiple assembled units of structure 100 are separated into individual units. The diameter of the via openings drilled in the copper laminated substrate can be approximately 150.0 microns.

Typically, all via openings are drilled at once using multiple diamond bits. At step 506, the sidewalls of the via openings are plated with copper in an electroless plating bath. By way of background, electroless plating refers to a method of plating that involves the deposition of metals such as copper, nickel, silver, gold, or palladium on the surface of a variety of materials by means of a reducing chemical bath. As a result of the electroless plating bath, the vias provide electrical and thermal conduction between the top and bottom surfaces of the copper laminated substrate. In one embodiment, after completion of the electroless plating process, the via hole diameter, such as via hole diameter 370 in FIGS. 3A and 3B, is approximately 110.0 microns.

At step 508, the via openings are filled with copper. Adding additional copper to the via openings increases the thermal conductivity of the vias by providing a larger cross-sectional area for thermal flow. Also, providing a larger cross-sectional area for electrical current flow increases the electrical conductivity of the vias. In the present embodiment, the via openings are partially filled with copper, while in another embodiment the via openings are completely filled with copper. In one embodiment of the invention, the vias are filled with tungsten.

At step 510, a mask is used to pattern conductors on the metallization layers on the top and bottom surfaces of the substrate. In the present exemplary embodiment, the metallization layers can be copper. At step 512, the excess copper is etched away, resulting in a defined metallization layer, also referred to as a printed circuit, on the top and bottom surfaces of the substrate. For example, in structure 400 in FIG. 4, a patterned metallization layer on bottom surface 436 includes, among other things, heat spreader 448, lands 412, 429, 432, 441, and 450, and traces 414, 430, 437, and 442.

In step 514, solder mask is applied to the top and bottom surfaces of the substrate, thereby covering the exposed patterned copper on the top and bottom surfaces of the substrate. Solder mask, among other things, prevents contamination of the substrate signal pads and lands. In step 516, solder mask is etched away to expose copper in the printed circuit areas where soldering would take place. For example, solder mask is etched away to expose support pad 108, substrate signal pads 104 and 106, lands 150 and 152, and heat spreader 148 shown in FIG. 1. In step 518, the exposed copper in the printed circuit areas, where soldering would take place, such as support pad 108, substrate signal pads 104 and 106, lands 150 and 152, and heat spreader 148 shown in FIG. 1, is plated with a layer of nickel, followed by a layer of gold plating on top of the nickel plated copper. The gold/nickel plating protects the exposed copper from oxidation. Also, the gold/nickel plating prepares the exposed copper for soldering at the printed circuit support pad, substrate signal pads, lands, and heat spreader, such as support pad 108, substrate signal pads 104 and 106, lands 150 and 152, and heat spreader 148 shown in FIG. 1.

At step 520, utilizing the flip chip technology, a semiconductor die is mounted on a top surface of a substrate that is precoated with solder paste. For example, in structure 100 in FIG. 1, semiconductor die 102 is shown mounted on top surface 126 of substrate 128. As discussed above, in flip chip technology, the semiconductor die is "flipped" over so that the active surface of the die faces the top surface of the substrate. In flip chip technology, the electrical contact between the semiconductor die and the top surface of the substrate is achieved through an area array comprised of "solder bumps" that are placed on the active surface of the die. For example, solder bumps 210 are shown placed on semiconductor die ground pads 212 on active surface 224 of semiconductor die 202 in FIG. 2.

At step 522, the solder bumped semiconductor die that is mounted on the top surface of the substrate is taken through a "reflow process" in a "reflow oven." During the reflow process the solder bumps on the semiconductor die and the precoated paste on the substrate are melted and form strong adhesion and strong electrical contact to each other. After the solder bumps are melted, or collapsed, the distance between conductors on the active surface of the semiconductor die and conductors on the top surface of the substrate is approximately 80.0 to 110.0 microns. For example, in structure 100 in FIG. 1, the distance between semiconductor die ground pads 112 on semiconductor die 102 and support pad 108 on top surface 126 of substrate 128 after solder bumps 114 and 118 and solder bumps 110 are melted is approximately 80.0 to 110.0 microns.

At step 524, an optional underfill, such as underfill 122 shown in FIG. 1, is dispensed in the interface area between the semiconductor die and the top surface of the substrate. In structure 100 in FIG. 1, underfill 122 can comprise a polymer containing PCM microspheres. The underfill can be dispensed by means of a needle. The dispensed underfill is distributed throughout the interface area between the semiconductor die and the top surface of the substrate by a capillary action. Capillary action refers to a process by which the force of adhesion between a solid surface, e.g. the solid surface of the semiconductor die or the top surface of the substrate, and a liquid causes the liquid to be raised or moved against the solid surface.

At step 526, the semiconductor die, such as semiconductor die 102 shown in FIG. 1, is encapsulated in an appropriate mold compound. The mold compound provides protection from contamination or physical damage in subsequent manufacturing processes and during use. The mold compound, for example, can comprise various chemical compounds, such as multifunctional epoxy, novolac, and biphenyl resin, or a combination thereof. At step 528, the strip containing multiple assembled units of structure 100 is saw singulated into individual units. In saw singulation, the individual assembled units of structure 100 are diced from the strip containing multiple assembled units of structure 100 to result in a large number of structures such as structure 100. It is noted that the process described by reference to FIG. 5 is only one method of fabricating structure 100 in FIG. 1. It is also noted that variations and modifications to the overall method or to each individual step discussed in relation to FIG. 5 are obvious to a person of ordinary skill in the art. Also at step 528, the exemplary process by which structure 100 in FIG. 1 is fabricated ends.

Figure 6:
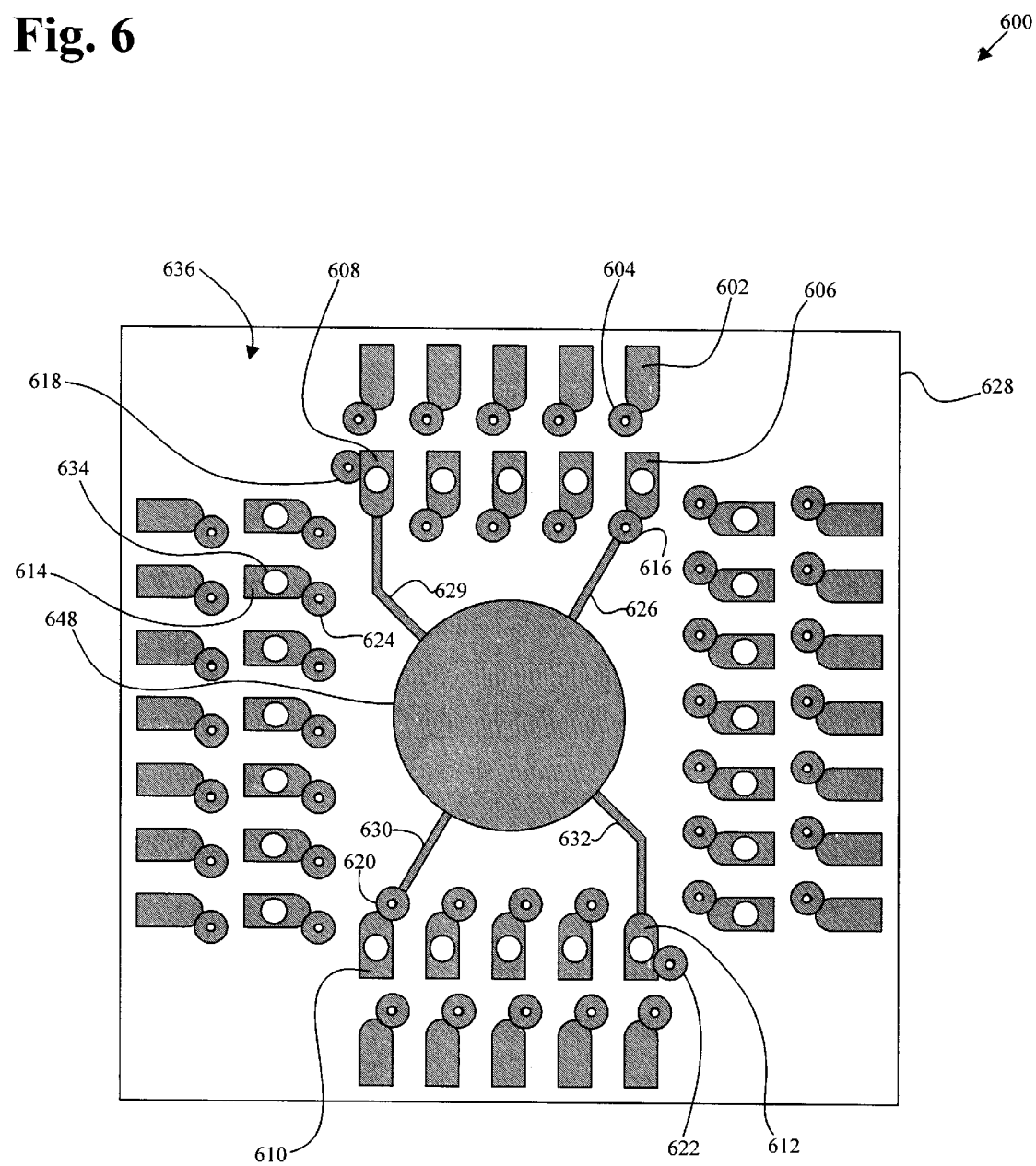
FIG. 6 illustrates a bottom view of an embodiment of the present invention after completion of a "saw singulation" step.

Structure 600 in FIG. 6 illustrates a bottom view of an exemplary structure in accordance with one embodiment of the present invention after completion of a "saw singulation" step. Structure 600 comprises substrate 628 corresponding to substrate 128 in FIG. 1. However, in contrast to structure 100 in FIG. 1, structure 600 includes lands in "inner rows" and lands in "outer rows" on bottom surface 636 of substrate 628. For example, outer row land 602 is located in an "outer row" of lands, and inner row land 608 is located in an "inner row" of lands on bottom surface 636 of substrate 628. In contrast, in structure 100 in FIG. 1, the lands are situated in a single row on the periphery of the bottom surface of the substrate. For example, in structure 100, lands 150 and 152 are situated in a single row on the periphery of bottom surface 136 of substrate 128.

In structure 600 in FIG. 6, outer row land 602 abuts outer row via 604. Inner row lands 606, 608, 610, 612, and 614, respectively, abut vias 616, 618, 620, 622, and 624. Trace 626 connects inner row via 616 and heat spreader 648. Trace 630 connects inner row via 620 and heat spreader 648. Trace 629 connects inner row land 608 and heat spreader 648. Trace 632 connects inner row land 612 and heat spreader 648. Therefore, in structure 600 in FIG. 6, inner row vias 616, 618, 620, and 622, respectively, are connected by traces 626, 629, 630, and 632 to heat spreader 448. Also shown in FIG. 6, solder ball 634 is placed on inner row land 614 in a manner known in the art. It is noted that in FIG. 6, only outer row via 604, inner row vias 616, 618, 620. and 622, outer row land 602, inner row lands 606, 608, 610, and 612, and solder ball 634 are specifically discussed herein to preserve brevity.

In structure 600 in FIG. 6, the inner row lands, such as inner row land 614, are recessed in solder mask (the solder mask is not shown in FIG. 6). Good connectivity is difficult to insure between the inner row lands, such as inner row land 606 in FIG. 6, and a printed circuit board, such as PCB 162 in FIG. 1, because the inner row lands are recessed below the "seating plane" formed by the solder mask surface. To insure good connectivity between the inner row lands and a printed circuit board, such as PCB 162 in FIG. 1, solder balls, such as solder ball 634 in FIG. 6, are placed on the inner row lands, such as inner row land 614. In structure 600, the new "seating plane" formed by the solder balls placed on the inner row lands is approximately 75.0 microns above the old "seating plane" formed by the solder mask surface. Thus, structure 600 in FIG. 6 insures good connectivity between the inner row lands, such as inner row land 606, and a printed circuit board, such as PCB 162 in FIG. 1, by placing solder balls on the inner row lands.

The electrical and thermal characteristics of the present embodiment of the invention will now be discussed. In structure 100 in FIG. 1, solder bumps 110 provide an electrical ground connection between semiconductor die ground pads 112 on active surface 124 of semiconductor die 102 and support pad 108. Additionally, as stated above, after solder bumps 110 are collapsed during the reflow process, the distance between semiconductor die ground pads 112 on active surface 124 of semiconductor die 102 and support pad 108 on top surface 126 of substrate 128 is only approximately 80.0 to 110.0 microns. Thus, by utilizing solder bumps 110 to electrically connect semiconductor die ground pads 112 and support pad 108, structure 100 provides a minimal length electrical ground connection between semiconductor die ground pads 112 and support pad 108 of approximately 80.0 to 110.0 microns. Also, vias 146 electrically connect support pad 108 and heat spreader 148. Thus, solder bumps 110, support pad 108, vias 146, and heat spreader 148 combine to provide a minimal length, low resistance, and low inductance ground connection between semiconductor die ground pads 112 and heat spreader 148.

Additionally, in structure 100 in FIG. 1, a large number of vias 146 can be used. Since vias 146 are electrically connected in parallel between support pad 108 and heat spreader 148, they (i.e. vias 146) provide a much lower resistive and inductive path that would have been provided by a single via. Thus, through the utilization of multiple vias, such as vias 146 in FIG. 1, structure 100 provides a low resistance, low inductance, minimal length electrical ground connection between support pad 108 and heat spreader 148.

In summary, structure 100 in FIG. 1 provides thermal conduction of excess heat away from semiconductor die 102 by way of support pad 108, vias 146, and heat spreader 148. In structure 100, vias 146 can be filled with a thermally conductive metal such as copper while support pad 108 can also comprise a thermally conductive metal such as copper. Also, the large surface area of support pad 108 provides a large conduit for the conduction of heat generated by semiconductor die 102. Similarly, heat spreader 148 can be a thermally conductive metal such as copper and the large surface area of heat spreader 148 provides a large conduit for the conduction of heat flowing through vias 146. Vias 146 also provide an efficient and "multiple" thermal connection between support pad 108 and heat spreader 148. Thus, through the utilization of support pad 108, vias 146, and heat spreader 148, structure 100 provides an effective mechanism to dissipate heat generated by semiconductor die 102.

It is noted that a difference may exist in the coefficient of thermal expansion ("CTE") of structure 100 in FIG. 1, and PCB 162 because of a difference in the materials used to fabricate structure 100 and PCB 162. As a result, when structure 100 heats up due to operating or environmental factors, structure 100 may expand at a different rate than PCB 162. The difference in the rate of expansion of structure 100 and PCB 162 creates a corresponding strain on the "solder joint" that connects structure 100 and PCB 162. The "solder joint" comprises the individual solder connections, also referred to as solders 156 and 160, respectively, between PCB 162 and lands 150 and 152, and the solder connection, also referred to as solder 158, between PCB 162 and heat spreader 148. However, heat spreader 148 is much larger in size than lands 150 and 152. The proportionally larger size of heat spreader 148 allows heat spreader 148 to absorb a corresponding larger amount of the overall strain on its "solder joint." Therefore, heat spreader 148 increases the physical reliability of structure 100 by absorbing a large amount of the overall strain on its "solder joint."

It is appreciated by the above detailed description that the invention provides leadless flip chip carrier design and structure. The invention provides efficient dissipation of heat generated by the semiconductor die. Further, the invention provides low parasitics, and a low inductance and resistance ground connection. From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, leadless flip chip carrier design and structure have been described.

What is claimed is:

1. A structure comprising:
   a substrate having a top surface for receiving a die having a plurality of solder bumps on an active surface of said die;
   a heat spreader situated on a bottom surface of said substrate;
   a printed circuit board attached to said bottom surface of said substrate, said heat spreader attached to a top surface of said printed circuit board;
   a first via and a second via in said substrate;
   said first via providing an electrical connection between a signal pad of said die and said printed circuit board, said second via providing a thermal connection between said die and said heat spreader.

2. The structure of claim 1 wherein said die is a semiconductor die.

3. The structure of claim 1 wherein said substrate comprises organic material.

4. The structure of claim 3 wherein said organic material is selected from the group consisting of polytetrafluoroethylene material and FR4 laminate material.

5. The structure of claim 1 wherein said substrate comprises a ceramic material.

6. The structure of claim 1 wherein said first via provides an electrical connection between a substrate signal pad and said printed circuit board, wherein said substrate signal pad is electrically connected to said signal pad of said die.

7. The structure of claim 6 wherein said first via abuts said substrate signal pad.

8. The structure of claim 6 wherein said substrate signal pad is electrically connected to said signal pad of said die by a signal solder bump.

9. The structure of claim 1 wherein said first via provides an electrical connection between said signal pad of said die and a land, said land being electrically connected to said printed circuit board.

10. The structure of claim 9 wherein said first via abuts said land.

11. The structure of claim 1 wherein said first via provides an electrical connection between a substrate signal pad and a land, wherein said substrate signal pad is electrically connected to said signal pad of said die, and wherein said land is electrically connected to said printed circuit board.

12. The structure of claim 11 wherein said first via abuts said substrate signal pad and said land.

13. The structure of claim 11 wherein said substrate signal pad is electrically connected to said signal pad of said die by a signal solder bump.

14. The structure of claim 12 wherein said substrate signal pad is electrically connected to said signal pad of said die by a signal solder bump.

15. The structure of claim 1 wherein said first via comprises copper.

16. The structure of claim 1 wherein said first via comprises a thermally conductive material.

* * * * *